US012690392B2

(12) United States Patent
Zhu et al.

(10) Patent No.: US 12,690,392 B2
(45) Date of Patent: Jul. 21, 2026

(54) PIEZOELECTRIC SPEAKERS

(71) Applicant: SHENZHEN SHOKZ CO., LTD.,
Shenzhen (CN)

(72) Inventors: Guangyuan Zhu, Shenzhen (CN); Lei Zhang, Shenzhen (CN); Xin Qi, Shenzhen (CN)

(73) Assignee: SHENZHEN SHOKZ CO., LTD.,
Shenzhen (CN)

( * ) Notice: Subject to any disclaimer, the term of this patent is extended or adjusted under 35 U.S.C. 154(b) by 763 days.

(21) Appl. No.: 18/167,089

(22) Filed: Feb. 10, 2023

(65) Prior Publication Data

US 2023/0329119 A1      Oct. 12, 2023

Related U.S. Application Data

(63) Continuation of application No. PCT/CN2022/085572, filed on Apr. 7, 2022.

(51) Int. Cl.
*H10N 30/20*          (2023.01)
*H04R 17/00*          (2006.01)
*H10N 30/50*          (2023.01)

(52) U.S. Cl.
CPC ......... *H10N 30/2047* (2023.02); *H04R 17/00* (2013.01); *H10N 30/2042* (2023.02); *H10N 30/50* (2023.02)

(58) Field of Classification Search
CPC .......... H04R 17/04; H04R 17/10; B06B 1/06; B06B 1/08; B06B 1/10; H01L 41/047
See application file for complete search history.

(56) References Cited

U.S. PATENT DOCUMENTS

| | | | | |
|---|---|---|---|---|
| 4,654,554 A | | 3/1987 | Kishi | |
| 2010/0086151 A1* | | 4/2010 | Ruiter | H04R 17/00 |
| | | | | 381/190 |
| 2011/0255718 A1 | | 10/2011 | Fukushima et al. | |
| 2012/0155678 A1* | | 6/2012 | Liu | H04R 17/00 |
| | | | | 381/190 |
| 2014/0098978 A1* | | 4/2014 | Fukuoka | H04R 1/26 |
| | | | | 381/190 |
| 2014/0346929 A1* | | 11/2014 | Kim | B06B 1/14 |
| | | | | 310/329 |
| 2016/0014525 A1* | | 1/2016 | Park | H10N 30/50 |
| | | | | 381/190 |

(Continued)

FOREIGN PATENT DOCUMENTS

| | | |
|---|---|---|
| CN | 201227623 Y | 4/2009 |
| CN | 201623850 U | 11/2010 |

(Continued)

*Primary Examiner* — Bumsuk Won
(74) *Attorney, Agent, or Firm* — METIS IP LLC

(57) ABSTRACT

The present disclosure is of a piezoelectric speaker. The piezoelectric speaker includes a plurality of piezoelectric elements and a vibration transmission plate. Each piezoelectric element is configured to generate vibration based on an audio signal. The vibration transmission plate includes a plurality of elastic rods and a mass block, and each elastic rod connects the mass block and one of the plurality of piezoelectric elements. The mass block simultaneously receives the vibration of the plurality of piezoelectric elements and generates at least two resonance peaks in a frequency range of 20 Hz-40000 Hz.

20 Claims, 10 Drawing Sheets

(56)                    References Cited

U.S. PATENT DOCUMENTS

2018/0176692 A1*   6/2018   Doshida ............... H04R 1/1008
2021/0176574 A1*   6/2021   Bergs .................... H04R 25/65

FOREIGN PATENT DOCUMENTS

| | | | |
|---|---|---|---|
| CN | 102395092 | A | 3/2012 |
| CN | 105101020 | A | 11/2015 |
| CN | 204887455 | U | 12/2015 |
| CN | 113141565 | A | 7/2021 |
| FR | 2574609 | A1 | 6/1986 |
| JP | S56106497 | A | 8/1981 |
| JP | 2018186571 | A | 11/2018 |
| KR | 100729152 | B1 | 6/2007 |

* cited by examiner

PIEZOELECTRIC SPEAKERS

CROSS-REFERENCE TO RELATED APPLICATIONS

This application is a continuation of International Application No. PCT/CN2022/085572, filed on Apr. 7, 2022, the entire contents of each of which are hereby incorporated by reference.

TECHNICAL FIELD

The present disclosure relates to the field of acoustics, and in particular, to piezoelectric speakers.

BACKGROUND

An acoustic output device driven by piezoelectric ceramics generates vibration to radiate sound waves outward using an inverse piezoelectric effect of piezoelectric ceramic materials. Compared with a traditional electrodynamic acoustic output device, the acoustic output device driven by piezoelectric ceramics has the advantages of high electromechanical conversion efficiency, low energy consumption, small size, and high integration.

However, compared with the traditional electromagnetic acoustic output device, the acoustic output device driven by piezoelectric ceramics has poor sound quality which mainly results from the poor low-frequency response, many vibration modes in the target frequency range, and a flat frequency response curve which cannot form in the audible domain.

Therefore, it is desirable to provide a piezoelectric speaker with good low-frequency response and few vibration modes in a target frequency range.

SUMMARY

One of the embodiments of the present disclosure provides a piezoelectric speaker. The piezoelectric speaker includes a plurality of piezoelectric elements and a vibration transmission plate. Each piezoelectric element is configured to generate vibration based on an audio signal. The vibration transmission plate includes a plurality of elastic rods and a mass block. Each elastic rod connects the mass block and one of the plurality of piezoelectric elements. The mass block simultaneously receives vibration of the plurality of piezoelectric elements and generates at least two resonance peaks in a frequency range of 20 Hz-40000 Hz.

In some embodiments, the at least two resonance peaks may include a first resonance peak and a second resonance peak. A resonant frequency range corresponding to the first resonance peak may be 50 Hz-2000 Hz. A resonant frequency range corresponding to the second resonance peak may be 1000 Hz-40000 Hz. A resonant frequency corresponding to the first resonance peak may be less than a resonant frequency corresponding to the second resonance peak.

In some embodiments, a mass of the mass block may be less than or equal to 10 g.

In some embodiments, a ratio of an elasticity coefficient of the plurality of elastic rods to the mass of the mass block may be within a range of $4.9 \times 10^6$ N/(m*kg)–$3.2 \times 10^{11}$ N/(m*kg).

In some embodiments, the piezoelectric element may include a piezoelectric layer and a basal layer. The piezoelectric layer may be attached to one side of the basal layer, and the piezoelectric layer or the basal layer may be connected with one of the plurality of elastic rods.

In some embodiments, a projected area of the piezoelectric layer in a thickness direction of the piezoelectric element may be less than a projected area of the basal layer in the thickness direction of the piezoelectric element.

In some embodiments, the electrical element may include a first piezoelectric layer, a basal layer, and a second piezoelectric layer disposed in sequence, and the first piezoelectric layer and the second piezoelectric layer may be attached to both sides of the basal layer, respectively.

In some embodiments, the projected area of the first piezoelectric layer or the second piezoelectric layer in the thickness direction of the piezoelectric element may be less than a projected area of the basal layer in the thickness direction of the piezoelectric element.

In some embodiments, a surface of the piezoelectric element may be provided with a damping structural layer.

In some embodiments, the plurality of piezoelectric elements may be evenly spaced along a circumferent side of the mass block, and lengths of the plurality of elastic rods connecting the plurality of piezoelectric elements and the mass block may be same.

In some embodiments, the plurality of piezoelectric elements may be spaced at intervals along a circumferent side of the mass block, and lengths of the plurality of elastic rods connecting the plurality of piezoelectric elements and the mass block may be different.

In some embodiments, when the mass block vibrates in a direction perpendicular to a surface of the mass block, moments of the plurality of elastic rods acting on a mass block may be balanced in the direction perpendicular to the surface of the mass block.

In some embodiments, when the mass block vibrates in the direction perpendicular to the surface of the mass block, a difference between a maximum displacement value at the surface of the mass block and a minimum displacement value at the surface of the mass block may be less than 0.3 mm in the direction perpendicular to the surface of the mass block.

In some embodiments, the piezoelectric speaker may include a housing having an accommodation space. The plurality of piezoelectric elements and the vibration transmission plate may be located in the accommodation space, and the mass block of the vibration transmission plate may be connected with a side wall corresponding to one end of the housing.

In some embodiments, the piezoelectric speaker may include a housing. The housing may be a columnar structure with an accommodation space. The plurality of piezoelectric elements and the vibration transmission plate may be located in the accommodation space. An end of each piezoelectric element may be connected with a side wall of the housing. An end of each piezoelectric element away from the housing may be connected with one of the elastic rods. The housing may include a top wall fitted to a head region of a user, and the mass block may be connected with the top wall through the elastic rod disposed on a circumferential side of the mass block.

In some embodiments, there may be a first connecting piece between the mass block and the plurality of elastic rods.

In some embodiments, the piezoelectric speaker may include a housing and a diaphragm. The diaphragm may be connected with the housing. The housing may be a columnar structure with an accommodation space. The plurality of piezoelectric elements and the vibration transmission plate may be located in the accommodation space. The diaphragm and the plurality of piezoelectric elements may be connected through the mass block. The plurality of piezoelectric elements may drive the diaphragm to vibrate by acting on the mass block. A vibration direction of the plurality of piezoelectric elements may be the same as a vibration direction of the diaphragm.

In some embodiments, the housing may include a first side wall. A central region of the first side wall may be provided with an opening. The diaphragm may be located at the opening and may be connected with a side wall of the housing corresponding to the opening through a circumferential side of the diaphragm.

In some embodiments, the mass block may include a first connecting part and a second connecting part connected in sequence. The first connecting part may be connected with the diaphragm, and the second connecting part may be connected with the elastic rod. A cross-sectional area of the first connecting part along a direction perpendicular to the vibration direction of the diaphragm may be greater than a cross-sectional area of the second connecting part along a direction perpendicular to the vibration direction of the diaphragm.

In some embodiments, the mass block may include a base and a protrusion. The protrusion may be distributed along an edge of the base. The protrusion may be connected with a folding ring of the diaphragm, and the base may be connected with the plurality of elastic rods.

In some embodiments, a first hole may be disposed on the base, and a second hole may be disposed on a second side wall of the housing away from the opening.

In some embodiments, the piezoelectric speaker may include a first housing. An end of the first housing may be an opening end, and the opening end may be fitted to the first side wall. The first side wall, the diaphragm, and the first housing may form a front cavity, and a sound hole may be disposed on the side wall of the first housing.

DETAILED DESCRIPTION

Figure 1:
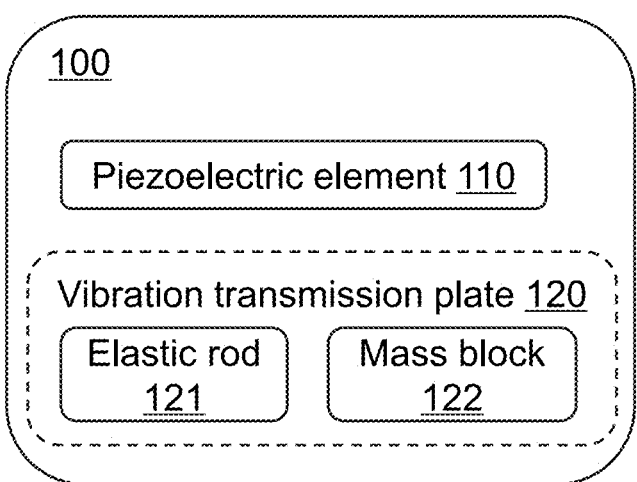
FIG. 1 is a block diagram illustrating an exemplary piezoelectric speaker according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections, or assemblies of different levels. However, if other words can achieve the same purpose, the words can be replaced by other expressions.

As used in the disclosure and the appended claims, the singular forms "a," "an," and "the" include plural referents unless the content clearly dictates otherwise; the plural forms may be intended to include singular forms as well. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The embodiments of the present disclosure illustrate a piezoelectric speaker. In some embodiments, a piezoelectric speaker may include a plurality of piezoelectric elements. Each of the plurality of piezoelectric elements may be configured to generate vibration based on an audio signal. In some embodiments, the piezoelectric speaker may further include a vibration transmission plate. The vibration transmission plate may include a plurality of elastic rods and a mass block. Each elastic rod may connect the mass block and one of the plurality of piezoelectric elements. The mass block may simultaneously receive vibration of the plurality of piezoelectric elements through the elastic rods. Specifically, the audio signal (e.g., an electrical signal with a sound signal) of the piezoelectric speaker may act on a piezoelectric layer of the piezoelectric element, causing the piezoelectric layer to deform, that is, generate vibration. The mass block may receive the vibration from the plurality of piezoelectric elements through the elastic rods, thereby generating sound. In some embodiments, a frequency response curve corresponding to the piezoelectric speaker may have at least two resonance peaks in a frequency range of 20 Hz-40000 Hz. In some embodiments, the at least two resonance peaks may include a first resonance peak and a second resonance peak. A resonant frequency range corresponding to the first resonance peak may be 50 Hz-2000 Hz. A resonant frequency range corresponding to the second resonance peak may be 1000 Hz-40000 Hz. A resonant frequency corresponding to the first resonance peak may be less than a resonant frequency corresponding to the second resonance peak. The piezoelectric speaker provided in the embodiments of the present disclosure may receive the vibration of the piezoelectric element through the vibration transmission plate, and adjust parameter information of the elastic rod and the mass block, so that the piezoelectric speaker can have relatively good sensitivity at a relatively low frequency (e.g., 50 Hz-2000 Hz). Meanwhile, the piezoelectric speaker may also have relatively good sensitivity at a relatively high frequency (e.g., 1000 Hz-40000 Hz) by utilizing characteristic of the piezoelectric element (e.g., a natural frequency of the piezoelectric element). In addition, the piezoelectric speaker provided in the embodiment of the present disclosure may use the piezoelectric element and the vibration transmission plate (e.g., the mass block and the elastic rod) as an acoustic transducer device, so that the frequency response curve corresponding to the piezoelectric speaker between the first resonance peak and the second resonance peak is relatively flat, thereby ensuring that the piezoelectric speaker has better sound quality. In some embodiments, the piezoelectric speaker may include a bone conduction speaker or an air conduction speaker. In some embodiments, the piezoelectric speaker may be applied to an electronic device with an audio function (e.g., an earphone, glasses, a smart helmet, a voice box, a tablet computer, a mobile phone, etc.).

FIG. 1 is a block diagram illustrating an exemplary piezoelectric speaker according to some embodiments of the present disclosure. As shown in FIG. 1, the piezoelectric speaker 100 may include a piezoelectric element 110 and a vibration transmission plate 120.

The piezoelectric speaker 100 may refer to a device that converts an audio signal (e.g., an electrical signal containing sound information) into sound. In some embodiments, the piezoelectric speaker 100 may be applied to glasses, a smart bracelet, an earphone, a hearing aid, a smart helmet, a smart watch, smart clothing, a smart backpack, smart accessories, or the like, or any combination thereof. For example, the piezoelectric speaker 100 may be applied to functional myopia glasses, presbyopic glasses, cycling glasses, sunglasses, etc., or intelligent glasses, such as audio glasses with an earphone function. In some embodiments, the piezoelectric speaker 100 may also be applied to a head-mounted device such as a helmet, an augmented reality (AR) device, or a virtual reality (VR) device. In some embodiments, the AR device or the VR device may include a virtual reality helmet, virtual reality glasses, an augmented reality helmet, augmented reality glasses, or the like, or any combination thereof. For example, the VR devices and/or the AR device may include Google Glass, Oculus Rift, Hololens, Gear VR, etc.

The piezoelectric element 110 may be a device that converts the audio signal (e.g., an electrical signal containing sound information) into mechanical vibration. In some embodiments, the piezoelectric element 110 may include a piezoelectric layer that converts the audio signal into the mechanical vibration. Due to an inverse piezoelectric effect of the piezoelectric layer, when the electrical signal acts on the piezoelectric layer, the piezoelectric layer may generate mechanical vibration. In some embodiments, the piezoelectric layer may be made of piezoelectric materials. The exemplary piezoelectric materials may include piezoelectric ceramics, piezoelectric crystals (e.g., barium titanate, lead zirconate titanate, etc.), piezoelectric polymers (e.g., polyvinylidene fluoride), or the like, or any combination thereof. In some embodiments, the piezoelectric element 110 may be in any shape, such as a sheet structure, a block structure, a column structure, a ring structure, or the like, or any combination thereof. In some embodiments, the piezoelectric element may be the block structure (see FIG. 2 and the related description thereof). In some embodiments, the piezoelectric element may be a cantilever beam structure (see FIG. 4 and the related description thereof). In some embodiments, the piezoelectric element may also be the ring structure (see FIG. 9 and the related description thereof). In some embodiments, the piezoelectric element may be a laminated structure in which a plurality of ring-shaped structural layers are stacked sequentially. A polarization direction of the piezoelectric element with the laminated structure (e.g., the piezoelectric element 910 shown in FIG. 9) may be the same as a stress direction, and the polarization direction may be parallel to a lamination direction of the laminated structure. At this time, when the piezoelectric element is subjected to an electric field in the lamination direction, the piezoelectric element may vibrate in the lamination direction. In some embodiments, the polarization direction of the piezoelectric element (e.g., a piezoelectric element 410) may be perpendicular to the stress direction. When the piezoelectric element is subjected to an electric field perpendicular to a surface of the piezoelectric element, the piezoelectric element may be subject to stress along a length direction of the cantilever beam structure. At this time, the piezoelectric layer of the piezoelectric element may deform, which may drive an overall structure of the piezoelectric element to deform, thereby generating vibration along the polarization direction of the piezoelectric layer. Further description about the piezoelectric element may be found elsewhere in the present disclosure, such as FIGS. 4-11 and the related description thereof.

The vibration transmission plate 120 may be a component that converts the mechanical vibration from the piezoelectric element 110 into a sound signal. In some embodiments, the vibration transmission plate 120 may generate vibration in response to the vibration of the piezoelectric element 110, thereby generating sound. In some embodiments, the sound may include a bone conduction sound wave or an air conduction sound wave. The sound may be transmitted to the human ear through bone conduction or air conduction. Merely by way of example, when the sound is the bone conduction sound wave, at least part of the structure of the vibration transmission plate 120 may be in direct contact with a facial region of a user. The vibration transmission plate 120 may directly transmit the received vibration to an auditory nerve of the user through muscles, bones, blood, etc. of the user, so that the user may hear sound information corresponding to the sound signal. In some embodiments, the vibration transmission plate 120 may also be connected with a housing of the piezoelectric speaker 100. When the user wears the piezoelectric speaker 100, at least part of the structure of the housing may be in contact with the facial region of the user. The housing may transmit the received vibration directly to the auditory nerve of the user through muscles, bones, blood, etc. of the user, so that the user may hear the sound information corresponding to the sound signal. As another example, when the sound is the air conduction sound wave, the vibration transmission plate 120 may be connected with a diaphragm, and the diaphragm may be driven by the vibration transmission plate 120 to generate vibration, thereby driving air vibration of a diaphragm attachment, thereby generating an air conduction sound wave. When a user wears a piezoelectric speaker, the air conduction sound wave may pass to ears of the user through air.

In some embodiments, the vibration transmission plate 120 may include a plurality of elastic rods 121 and a mass block 122. Each elastic rod 121 may connect the mass block 122 and one of a plurality of piezoelectric elements 110, i.e., a count of the elastic rods 121 may correspond to a count of the piezoelectric elements 110. The vibration transmission plate 120 formed by the elastic rod 121 and the mass block 122 may be regarded as a resonator system. The elastic rod 121 may provide elasticity for the resonator system, and the mass block 122 may provide weight for the resonator system. In some embodiments, the elastic rod 121 may be a component with elasticity. For example, in some embodiments, the elastic rod 121 may be an elastic structure. An exemplary elastic structure may include a continuous bending structure, a spiral structure, a leaf spring structure, a mechanical spring, an air spring, an electromagnetic spring, or the like, or any combination thereof. As another example, in some embodiments, the elasticity of the elastic rod 121 may be provided by material of the elastic rod 121, that is, the elastic rod 121 may be made of elastic material. Exemplary elastic material may include foam, rubber, latex, silica gel, sponge, or the like, or any combination thereof. Further description about the elastic rod may be found elsewhere in the present disclosure, such as FIG. 2 and the related description thereof.

The mass block 122 may be a component with a mass. In some embodiments, the mass block 122 may be in any shape, such as a regular structure such as a cylinder, a cuboid, a cone, a circular truncated cone, a sphere, etc. or an irregular structure. In some embodiments, material of the mass block 122 may include, but is not limited to, any material with a certain rigidity, such as plastic, wood, metal, etc. In some embodiments, the material of the mass element 122 may also include various metamaterial such as negative stiffness material and cubic stiffness material that is beneficial to expand an audio bandwidth of the piezoelectric speaker 100. The vibration transmission plate 120 composed of the elastic rod 121 and the mass block 122 may make the piezoelectric speaker 100 have a resonance peak in a relatively low frequency range (e.g., 50 Hz-2000 Hz), thereby improving the low frequency response of the piezoelectric speaker 100. Further description about the mass block may be found elsewhere in the present disclosure, such as FIG. 2 and related description thereof.

In some embodiments, the piezoelectric speaker 100 may include the plurality of piezoelectric elements 110. One of the plurality of elastic rods 121 may connect the mass block 122 and one of the plurality of piezoelectric elements 110, and the mass block 122 may simultaneously receive the vibration of the plurality of piezoelectric elements 110 through the plurality of elastic rods 121, and generate and output vibration (e.g., sound wave). Vibration acceleration of the plurality of piezoelectric elements 110 may be transmitted to the mass block 122 through each elastic rod 121, and superimposed in a vibration output region of the mass block 122, which can effectively increase the output vibration amplitude, thereby increasing the audio output capability of the piezoelectric speaker 100. In some embodiments, a count of piezoelectric elements 110 may be positively related to the audio output capability of the piezoelectric speaker 100.

Figure 2:
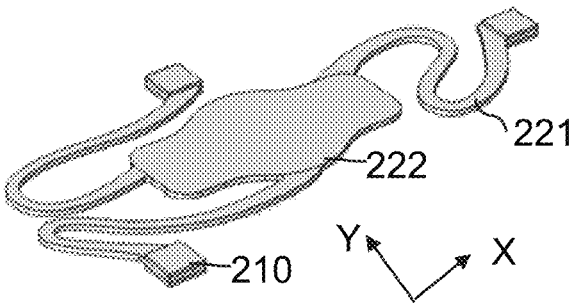
FIG. 2 is a schematic structural diagram illustrating an exemplary piezoelectric speaker according to some embodiments of the present disclosure.

FIG. 2 is a schematic structural diagram illustrating an exemplary piezoelectric speaker according to some embodiments of the present disclosure. As shown in FIG. 2, the piezoelectric speaker may include a plurality of piezoelectric elements 210, an elastic rod 221, and a mass block 222. Each of the plurality of piezoelectric elements 210 may be connected with the mass block 222 through the elastic rod 221.

In some embodiments, the piezoelectric element 210 may include a fixed end and a free end. The fixed end may be an end of the piezoelectric element 210 that provides fixing or supporting functions for other parts. For example, during vibration, vibration intensity of the fixed end may be less than that of other parts (e.g., the free end) of the piezoelectric element 210. Merely by way of example, the fixed end may be a position of the piezoelectric element 210 where the vibration acceleration is less than a vibration acceleration threshold or an acceleration level is less than an acceleration level threshold. In some embodiments, the fixed end may be connected with a fixed location or structure of the piezoelectric speaker. The fixed position or structure here may refer to a position or structure of the piezoelectric speaker where the vibration acceleration is less than the vibration acceleration threshold or the acceleration level is less than the acceleration level threshold. For example, the piezoelectric speaker may include a housing (not shown in FIG. 2), the piezoelectric element 210 may be disposed in the housing, and the fixed end may be fixedly connected with the housing. The free end may be an end of the piezoelectric element 210 that connects and drives other vibrating parts (e.g., the mass block, the diaphragm) in the piezoelectric speaker to vibrate to generate sound. The free end may vibrate more freely than the fixed end.

In some embodiments, the free end of the piezoelectric element 210 may be connected with a first end of the elastic rod 221. The connection may include bolt connection, riveting, interference fit, buckling, bonding, injection molding, welding, magnetic attraction, or the like, or any combination thereof. In some embodiments, a second end of the elastic rod 221 may be connected with any part of the mass block 222 (e.g., side, top, bottom, etc.). In some embodiments, the plurality of piezoelectric elements 210 may be spaced at intervals along a circumferential side of the mass block 222. The second ends of the plurality of elastic rods 221 may be connected with the circumferential side of the mass block 222 at intervals.

In some embodiments, the elastic rod 221 may also be a rod with one or more bending parts. Merely by way of example, the vibration transmission plate shown in FIG. 2 may have a length direction X and a width direction Y. In some embodiments, the elastic rod 221 may become "softer" by reducing an elastic coefficient of the elastic rod 221 in a specific direction (e.g., the length direction X), so as to effectively reduce impact of a load on the elastic rod 221 in the specific length direction, thereby increasing the service life of the vibration transmission plate. Exemplarily, by arranging one or more bending parts on the shaft of the elastic rod 221, a length of the elastic rod 221 may be increased in a limited space, thereby reducing the elastic coefficient of the elastic rod 221 in the length direction X of the vibration transmission plate. In some embodiments, counts of bending parts and curvature corresponding to the bending parts of the plurality of elastic rods 221 may be the same or different. Accordingly, the lengths of the plurality of elastic rods 221 may be the same or different. Here, the length of the elastic rod 221 may refer to a length when the elastic rod 221 is stretched into a straight rod. Merely by way of example, the elastic rod 221 may include a first elastic rod, a second elastic rod, and a third elastic rod. Count of bending parts of the first elastic rod, the second elastic rod, and the third elastic rod, and the curvature corresponding to the bending parts may be the same or different. For example, the first elastic rod, the second elastic rod, and the third elastic rod may all be a rod having a bending part. As another example, the first elastic rod and the second elastic rod may both be a rod having a bending part, and the third elastic rod may be a rod having two bending parts. In some embodiments, the elastic rod may be a straight rod. A centroid of the piezoelectric element and a centroid of the mass block corresponding to each elastic rod may be in one same straight line as the straight rod. In some embodiments, in order to balance moments of the plurality of elastic rods acting on the mass block and prevent deflection of a certain position when the mass block moves, the plurality of straight rods may be evenly spaced or substantially evenly distributed along the circumferential side of the mass block. Merely by way of example, the first elastic rod, the second elastic rod, and the third elastic rod may be all straight rods. An included angle between straight lines where adjacent straight rods are located is within a range of 105°-130° (e.g., 120°).

In some embodiments, it may also balance the moment of each elastic rod acting on the mass block possible and reduce the deflection or even flipping of the mass block when the mass block vibrates along a direction perpendicular to the surface (that is, an XY plane) of the mass block through adjusting a position, the length, and the count of bending parts of each elastic rod. Therefore, when the mass block vibrates in the direction perpendicular to the surface of the mass block, a difference between a minimum displacement value at the surface of the mass block and a maximum displacement value at the surface of the mass block in the direction perpendicular to the surface of the mass block may be less than 0.3 mm, which may avoid flipping of the mass block or make the mass block slightly slip, so that the mass block may be in a relatively balanced state when working (that is, moment of each elastic rod acting on the mass block may be balanced), thereby reducing the risk of fracture of the elastic rod and/or mass block under a flipping load.

In some embodiments, the plurality of piezoelectric elements may be evenly spaced along a circumferential side of the mass block, and lengths of the plurality of elastic rods connecting the plurality of piezoelectric elements and the mass block may be same, so that the moment of each elastic rod acting on the mass block may be balanced. For example, a shape of the mass block may be a circle, and the included angles formed by the connecting lines between two adjacent elastic rods and a center of the circle may be the same. As another example, the shape of the mass block may be an equilateral triangle, a count of elastic rods may be three, and an extension direction of each elastic rod may point to a center of the mass block of the equilateral triangle. In some embodiments, the lengths of the elastic rods may also be different. In this case, the elastic rods may be distributed asymmetrically along the circumferential side of the mass block, such as the elastic rod 221 and the mass block 222 shown in FIG. 2. The piezoelectric speaker is generally small in volume. Accordingly, internal space of the piezoelectric speaker may be limited, and demand for space may be reduced by using a plurality of asymmetric elastic rods. Merely by way of example, the plurality of asymmetric elastic rods with different lengths as shown in FIG. 2 may be accommodated in elliptical space (runway-shaped). The plurality of symmetrically distributed elastic rods may need to be accommodated in a circular space with larger volume. In some embodiments, spatial stability of the mass block 222 may be improved by providing a bending part, a connection position, etc. on the elastic rod 221. In some embodiments, in order to balance the moments of the plurality of asymmetrical elastic rods with different lengths acting on the mass block, the position, the length, and the count of bending parts of the elastic rod may be adjusted.

It should be noted that the count of elastic rods mentioned in the present disclosure is not limited to three as shown in FIG. 2, and may also be other numerical values. For example, the count of elastic rods may be two, and the two elastic rods may be respectively disposed on both sides of the mass block. For example, the count of elastic rods may be 4 or more. In addition, the plurality of elastic rods mentioned in the present disclosure may include a straight rod and a rod with the bending part at the same time.

In some embodiments, in order to increase an area of a vibration output region of the mass block 222 and facilitate other components of the piezoelectric speaker (such as a vibration plate or diaphragm) to receive the vibration of the mass block 222, the mass block 222 may be formed as a thin plate structure.

In some embodiments, a polarization direction of the piezoelectric element 210 may be perpendicular to a stress direction. When the piezoelectric element 210 is subjected to an electric field perpendicular to a surface of the piezoelectric element 210, the piezoelectric element 210 may be subjected to stress along a length direction of the piezoelectric element 210. At this time, a piezoelectric layer of the piezoelectric element 210 may deform, which may drive an overall structure of the piezoelectric element 210 to deform, thereby generating vibration along the polarization direction of the piezoelectric layer. The vibration acceleration of the plurality of piezoelectric elements 210 may be transmitted to the mass block 222 through each elastic rod 221, and superimposed in the vibration output region of the mass block 222. The length direction of the piezoelectric element may be understood as a direction of the fixed end pointing to the free end in the cantilever beam structure.

In some embodiments, a ratio of the elastic coefficient of the elastic rod to a mass of the mass block may be adjusted to cause that a resonant frequency corresponding to a first resonance peak may be within a target range, e.g., 50 Hz-2000 Hz. In some embodiments, the first resonance peak $f_0$, the mass m of the mass block, and elasticity k of the elastic rod satisfy a relationship of the following equation:

$$f_0 = \frac{1}{2\pi}\sqrt{\frac{k}{m}}. \tag{1}$$

In some embodiments, the first resonance peak of the piezoelectric speaker may be related to the mass of the mass block and the elastic coefficient of the elastic rod. In order to improve the sensitivity of the piezoelectric speaker in a low-frequency (or low-middle frequency) range, the first resonance peak of the piezoelectric speaker may be within a range of 50 Hz-2000 Hz by adjusting the mass of the mass block or the elastic coefficient of the elastic rod. In some embodiments, in order to control the overall mass of the piezoelectric speaker and an amplitude of the low-frequency resonance peak, the mass of the mass block may be set within a target mass range. In some embodiments, the target mass range may be less than or equal to 10 g. In some embodiments, the target mass range may be 0.01 g-10 g. In some embodiments, the target mass range may be 0.2 g-6 g. In some embodiments, the target mass range may be 1 g-5 g.

In some embodiments, the ratio of the elastic coefficient of the plurality of elastic rods to the mass may be set within a target ratio range. In some embodiments, the target ratio range may be $4.9 \times 10^6$ N/(m*kg)–$3.2 \times 10^{11}$ N/(m*kg). In some embodiments, the target ratio range may be $4.5 \times 10^6$ N/(m*kg)–$3 \times 10^{11}$ N/(m*kg). In some embodiments, the target ratio range may be $4 \times 10^6$ (N/m*kg)–$4 \times 10^{10}$ N/(m*kg). In some embodiments, the target ratio range may be $1 \times 10^6$ N/(m*kg)–$1 \times 10^9$ N/(m*kg). For example, when the mass of the mass block is 10 g and the elastic coefficient of the elastic rod is $4.9 \times 10^7$ N/m, the resonant frequency $f_0$ corresponding to the first resonance peak is 700 Hz (which is calculated by equation (1)). As another example, when the mass of the mass block is 5 g and the elastic coefficient of the elastic rod is $5 \times 10^8$ N/m, the resonant frequency $f_0$ corresponding to the first resonance peak is 1591.5 Hz. It should be noted that the elastic coefficient of the elastic rod refers to the elastic coefficient of all the elastic rods. For example, the count of elastic rods may be three, the three elastic rods may be regarded as an elastic system, and the elastic coefficient of the elastic rods may refer to the elastic coefficient of the elastic system.

In some embodiments, the resonant frequency range corresponding to the first resonance peak may be 50 Hz-2000 Hz, and the resonant frequency range corresponding to the second resonance peak may be 1000 Hz-40000 Hz. The first resonance peak may be related to the mass of the mass block and the elastic coefficient of the elastic rod. By adjusting the mass of the mass block or the elastic coefficient of the elastic rod, the resonant frequency range corresponding to the first resonance peak may be adjusted. The second resonance peak may be related to parameter information of the plurality of piezoelectric elements (e.g., material of the piezoelectric layer, thickness, length, width, etc. of the piezoelectric layer and/or basal layer, etc.). The plurality of piezoelectric elements may make a frequency response curve of the mass block flatter, thereby reducing vibration mode of the piezoelectric speaker in a relatively wide frequency range, e.g., 20 Hz-40000 Hz, so that acoustic performance in the frequency range can be greatly improved. In some embodiments, when the piezoelectric speaker is applied in the low-frequency range, the second resonance peak generated by the vibration of the piezoelectric element may be adjusted to a relatively low-frequency range, e.g., 1000 Hz-2000 Hz, so that the vibration response curve of the mass block may generate at least two resonance peaks in a frequency range of 50 Hz-2000 Hz. In some embodiments, when the piezoelectric speaker is applied in a middle-frequency range, both the first resonance peak and the second resonance peak may be adjusted to a middle-high frequency range, so that the vibration response curve of the mass block may generate at least two resonance peaks in a frequency range of 1000 Hz-10000 Hz. In some embodiments, when the piezoelectric speaker is applied in a high-frequency range, both the first resonance peak and the second resonance peak may be adjusted to a high-frequency range, so that the vibration response curve of the mass block may generate at least two resonance peaks in a frequency range of 5000 Hz-40000 Hz. It should be noted that the piezoelectric speaker applied in the low-frequency range or high-frequency range may be that the piezoelectric speaker is used as a low-frequency unit or a high-frequency unit inside an earphone core to achieve a supplementary effect in a specific frequency band, for example, improving amplitude response of a low frequency or a high frequency, for example, making the frequency response curve of the specific frequency band flatter, etc. A scene where the piezoelectric speaker is applied in the middle-frequency range may include a scene of a main sound generating unit of a communication acoustic device (e.g., a telephone headset, a walkie-talkie, etc.), or a scene of a communication mode of a communication device (e.g., a mobile phone), book listening, and a vocal mode of podcasting.

Figure 3:
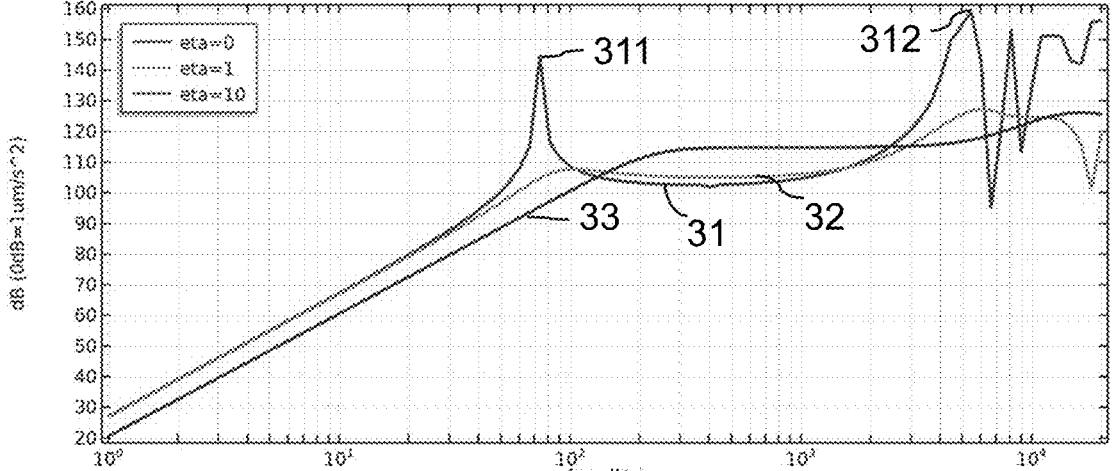
FIG. 3 is a vibration response curve of a mass block under different damping coefficients according to some embodiments of the present disclosure.

In some embodiments, the mass block may simultaneously receive the vibration of the plurality of piezoelectric elements and generate at least two resonance peaks within a relatively wide frequency range, e.g., 20 Hz-40000 Hz. FIG. 3 is a vibration response curve of a mass block under different damping coefficients according to some embodiments of the present disclosure. The damping coefficient may represent magnitude of damping. As shown in FIG. 3, when the damping coefficient eta (also known as isotropic loss factor) is 0, at least two resonance peaks of a vibration response curve 31 of the mass block may include a first resonance peak 311 and a second resonance peak 312, and a resonant frequency corresponding to the first resonance peak 311 may be less than a resonant frequency corresponding to the second resonance peak 312.

When the magnitude of the damping is changed, the vibration of the mass block may be subject to damping effect, which may make the vibration response curve flatter and reduce fluctuation of the vibration response curve, thereby further improving the sound quality of the sound signal generated by the piezoelectric speaker. In some embodiments, flatness of the vibration response curve of the mass block may be positively correlated with the magnitude of the damping. As shown in FIG. 3, when the damping coefficient eta is 1, a vibration response curve 32 of the mass block may be relatively flat, and amplitude of the resonance peak may decrease. When the damping coefficient eta is 10, a vibration response curve 33 of the mass block may be flatter without obvious resonance peak.

In some embodiments, in order to improve the sound quality of the piezoelectric speaker, a surface of the piezoelectric element may be provided with a damping structural layer. In some embodiments, in order to enable the damping structural layer to provide a corresponding damping effect and improve the sound quality of the piezoelectric speaker, a thickness ratio of thickness of the damping structural layer to thickness of the piezoelectric layer in the piezoelectric element may be greater than 5. Preferably, the thickness ratio of the thickness of the damping structural layer to the thickness of the piezoelectric layer in the piezoelectric element may be greater than 8. Preferably, the thickness ratio of the thickness of the damping structural layer to the thickness of the piezoelectric layer in the piezoelectric element may be within a range of 5-20. In some embodiments, the damping structural layer may be physically fixed to the surface of the piezoelectric element by means of bonding, etc. In some embodiments, the damping structural layer may be made of damping material. In some embodiments, to increase the damping effect, the elastic rod may be made of the damping material. In some embodiments, in order to increase the damping effect, the mass block may be connected with other structures of the piezoelectric speaker through the damping material or electromagnetic damping to transmit vibration. Exemplary damping material may include silicone, nitrile, rubber, foam, or the like, or any combination thereof.

Figure 4:
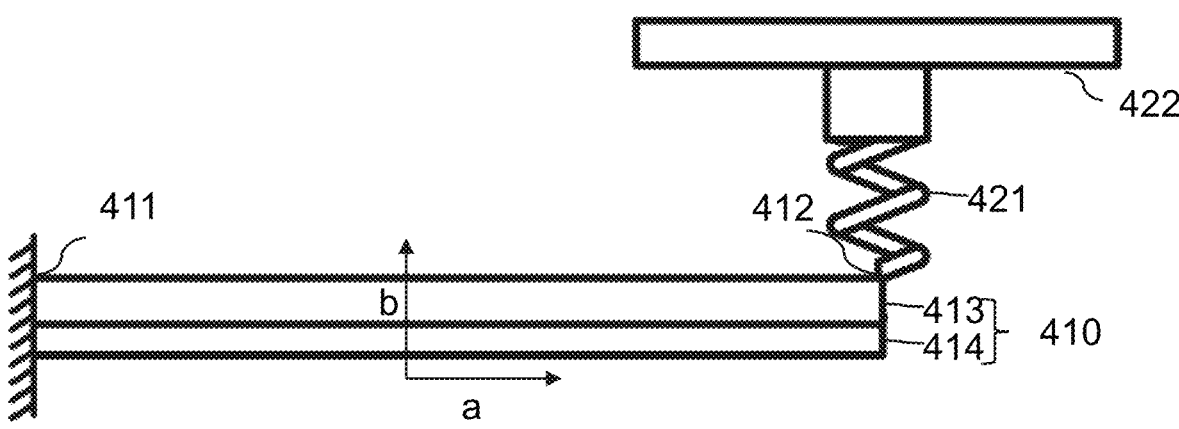
FIG. 4 is a schematic diagram illustrating a partial structure of a piezoelectric speaker with a single piezoelectric layer according to some embodiments of the present disclosure.
Figure 5:
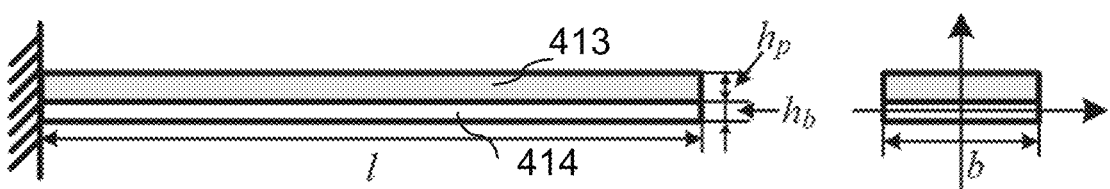
FIG. 5 is a parameter annotation diagram of a piezoelectric element with a single piezoelectric layer according to some embodiments of the present disclosure.

FIG. 4 is a schematic diagram illustrating a partial structure of a piezoelectric speaker with a single piezoelectric layer according to some embodiments of the present disclosure. As shown in FIG. 4, the piezoelectric speaker may include a vibration transmission plate and a piezoelectric element 410. The vibration transmission plate may include an elastic rod 421 and a mass block 422. The piezoelectric element 410 may be a cantilever beam structure. The elastic rod 421 may be connected with a suspended end of the electrical element 410. The mass block 422 may be connected with one end of the elastic rod 421 away from the piezoelectric element 410.

Two ends of the cantilever beam structure may be respectively a fixed end 411 and a free end 412. The fixed end 411 may be connected with a fixed position or structure (e.g., a housing) of the piezoelectric speaker. The free end 412 may be one end away from the fixed end 411. The free end 412 shown in FIG. 4 may be the suspended end of the piezoelectric element 410. Further description about the fixed end 411 and the free end 412 may be found in FIG. 2 and the related description thereof. In some embodiments, one end of the elastic rod 421 may be connected with the free end 412 of the piezoelectric element 410, and the other end of the elastic rod 421 may be connected with the mass block 422. A deformation direction of the elastic rod 421 may be approximately perpendicular to a length direction of the piezoelectric element 410 (see the direction a shown in FIG. 4). Further description about the elastic rod 421 and the mass block 422 may be found in FIG. 2 and the related description thereof.

In some embodiments, the piezoelectric element 410 may include a piezoelectric layer 413 and a basal layer 414. In some embodiments, the piezoelectric layer 413 may be made of piezoelectric material. In some embodiments, material of the basal layer 414 may include but is not limited to: metal and alloy, resin, glass fiber, carbon fiber, or the like, or any combination thereof. In some embodiments, the piezoelectric layer 413 and the basal layer 414 may be overlapped in a thickness direction of the piezoelectric element 410. In some embodiments, the piezoelectric layer 413 may be physically fixed on one side of the basal layer 414 by attachment, etc. In some embodiments, the piezoelectric layer 413 or the basal layer 414 may be connected with an elastic rod 421 of a plurality of elastic rods (not shown in FIG. 4).

Material of the piezoelectric layer 413 may be relatively brittle, and an edge of the piezoelectric layer 413 may protrude relative to an edge of the basal layer 414, which may easily cause the piezoelectric layer 413 to break during a vibration process. In some embodiments, in order to improve the service life of the piezoelectric element 410, a projected area of the piezoelectric layer 413 in the thickness direction of the piezoelectric element 410 may be less than a projected area of the basal layer 414 in the thickness direction of the piezoelectric element 410, and the piezoelectric layer 413 may be completely covered by the basal layer 414.

In the piezoelectric speaker shown in FIG. 4, a polarization direction of the piezoelectric element 410 may be perpendicular to a stress direction. When the piezoelectric element 410 is subjected to an electric field perpendicular to a surface of the piezoelectric element, the piezoelectric element 410 may be subjected to stress along a length direction of the cantilever beam structure (see the direction a shown in FIG. 4). At this time, the piezoelectric layer 413 of the piezoelectric element 410 may deform, which may drive an overall structure of the piezoelectric element 410 to deform, thereby generating vibration along the polarization direction of the piezoelectric layer 413. The polarization direction of the piezoelectric element 410 may be the thickness direction of the piezoelectric element 410 (see the direction b shown in FIG. 4). Further, the vibration of the piezoelectric element 410 may be transmitted to the mass block 422 through the elastic rod 421, and the mass block 422 may be connected with the housing or a vibration plate of the piezoelectric speaker to transmit the vibration to a user.

In some embodiments, in order to ensure sound quality, a length of the piezoelectric element 410 may need to be as small as possible, so that the piezoelectric speaker may have as few high-order modes as possible in a range of 20 Hz-20000 Hz. The length l of the piezoelectric element 410 may be related to elasticity modulus Eb of the basal layer 414, moment of inertia Ib of the basal layer 414, the elasticity modulus Ep of the piezoelectric layer 413, moment of inertia Ip of the piezoelectric layer 413, and unit length density ρl of the piezoelectric element 410. In some embodiments, the parameter information of the basal layer 414 and the parameter information of the piezoelectric layer 413 may be adjusted to make that the frequency response curve of the piezoelectric speaker in a range of 20 Hz-20000 Hz is relatively flat. Merely by way of example, the length of the piezoelectric element 410 may be within a range of 2 mm-10 mm, so that the frequency response curve of the piezoelectric speaker in the range of 20 Hz-20000 Hz may be relatively flat.

Figure 6:
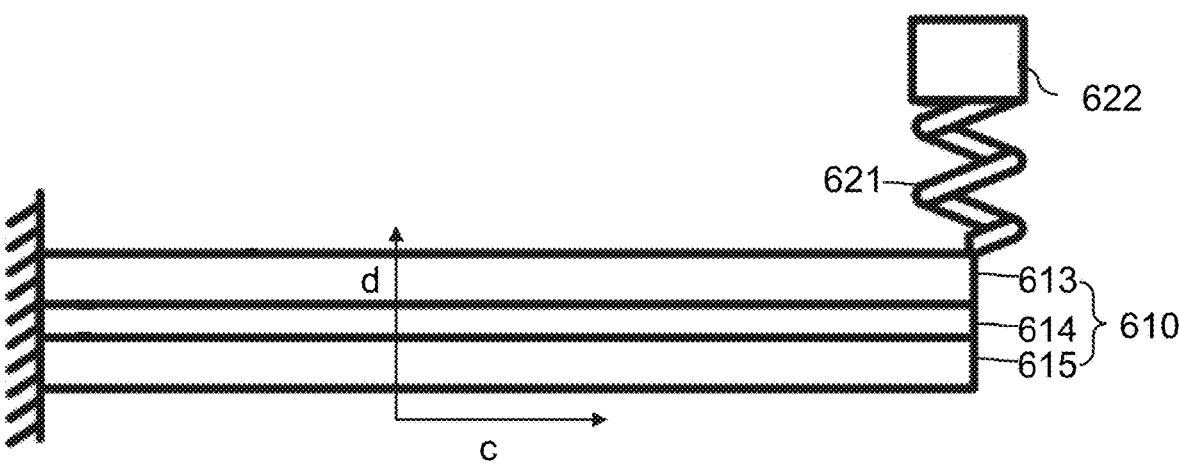
FIG. 6 is a schematic diagram illustrating a partial structure of a piezoelectric speaker with double piezoelectric layers according to some embodiments of the present disclosure.
Figure 7:
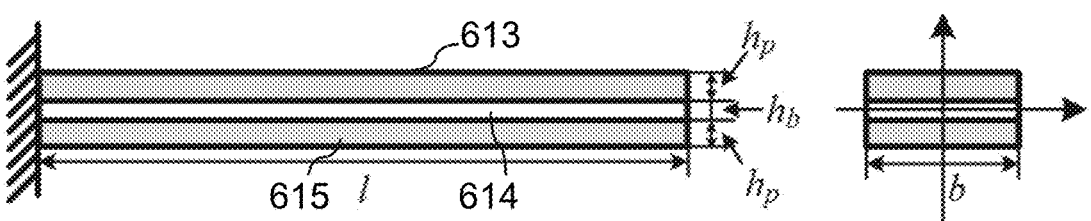
FIG. 7 is a parameter annotation diagram of a piezoelectric element with double piezoelectric layers according to some embodiments of the present disclosure.

FIG. 6 is a schematic diagram illustrating a partial structure of a piezoelectric speaker with double piezoelectric layers according to some embodiments of the present disclosure. An overall structure of the piezoelectric speaker shown in FIG. 6 may be similar to an overall structure of the piezoelectric speaker shown in FIG. 4. A main difference may be that a structure of a piezoelectric element 610 shown in FIG. 6 is different from a structure of a piezoelectric element 410 shown in FIG. 4. An elastic rod 621 and a mass block 622 shown in FIG. 6 may be similar to an elastic rod 421, a mass block 422, etc. shown in FIG. 4, respectively, which are not repeated herein.

In some embodiments, the piezoelectric element 610 may include a first piezoelectric layer 613, a basal layer 614, and a second piezoelectric layer 615 disposed in sequence. In some embodiments, the first piezoelectric layer 613 and the second piezoelectric layer 615 may be respectively attached to an upper surface and a lower surface of the piezoelectric element 610. In some embodiments, material and structure of the first piezoelectric layer 613 may be the same as that of the second piezoelectric layer 615. In some embodiments, the elastic rod 621 may be connected with the first piezoelectric layer 613, the basal layer 614, or the second piezoelectric layer 615 of the piezoelectric element 610. In some embodiments, material of the piezoelectric layer (e.g., the first piezoelectric layer 613 and the second piezoelectric layer 615) may be relatively brittle, and an edge of the piezoelectric layer may protrude relative to an edge of the basal layer 614, which may easily cause the piezoelectric layer to break during a vibration process. In order to ensure support of the basal layer 614 to the first piezoelectric layer 613 and the second piezoelectric layer 615 in a thickness direction of the piezoelectric element 610 (see the direction d shown in FIG. 6), and improve toughness of the overall structure of the electrical element 610, a projected area of the first piezoelectric layer 613 or the second piezoelectric layer 615 in the thickness direction of the piezoelectric element 610 may be less than a projected area of the basal layer 614 in the thickness direction of the piezoelectric element 610. Further description about the basal layer 614, the elastic rod 621, and the mass block 622 may be found in FIG. 4 and the related description thereof.

In some embodiments, by adjusting parameter information of the piezoelectric element 610 (e.g., the material of the first piezoelectric layer 613 and/or the second piezoelectric layer 615, thickness, length, and width of each structural layer), the resonant frequency of a second resonance peak of the piezoelectric speaker may be in a range of 1000 Hz-40000 Hz. In some embodiments, at least one of the length l of the piezoelectric element 610, the elastic modulus Eb of the basal layer 614, the moment of inertia Ib of the basal layer 614, the elastic modulus Ep of the first piezoelectric layer 613 or the second piezoelectric layer 615, the moment of inertia Ip of the first piezoelectric layer 613 or the second piezoelectric layer 615, the unit length density ρl of the piezoelectric element 610, etc. may be adjusted, so that the resonant frequency of the second resonance peak of the piezoelectric speaker may be in the range of 1000 Hz-40000 Hz. Merely by way of example, the length of the piezoelectric element 610 may be within a range of 2 mm-10 mm, the thickness of the basal layer 614 may be less than 1 mm, and the thickness of the first piezoelectric layer 613 or the second piezoelectric layer 615 may be less than 2 mm, so that the resonant frequency of the second resonance peak of the electric speaker may be within the range of 1000 Hz-40000 Hz.

Figure 8:
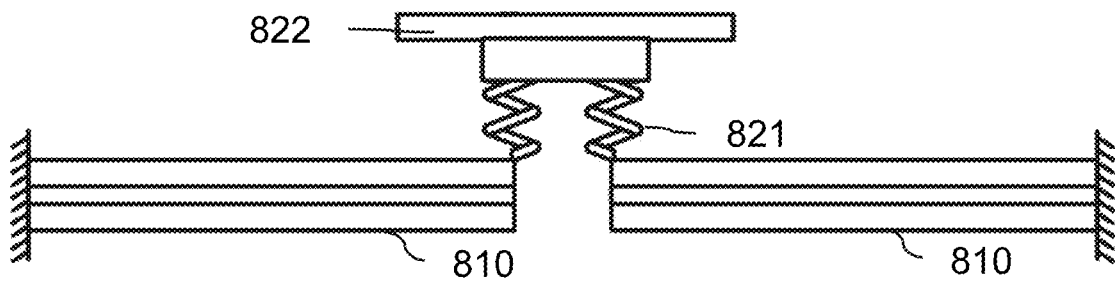
FIG. 8 is a schematic structural diagram illustrating an exemplary piezoelectric speaker according to other embodiments of the present disclosure.

FIG. 8 is a schematic structural diagram illustrating an exemplary piezoelectric speaker according to other embodiments of the present disclosure. As shown in FIG. 8, the piezoelectric speaker may include a plurality of piezoelectric elements 810, a mass block 822, and an elastic rod 821. The plurality of piezoelectric elements 810 and the mass block 822 may be respectively connected through the elastic rod 821.

In some embodiments, in order to ensure that free ends of the plurality of piezoelectric elements 810 generate a same vibration amplitude and vibration frequency based on a same audio signal, and prevent the mass block 822 from being greatly deflected during a vibration process, the plurality of piezoelectric elements 10 may be the same piezoelectric element. For example, a factor such as length, thickness, material, etc. corresponding to the plurality of piezoelectric elements 810 and a piezoelectric layer or a basal layer may be the same. In some embodiments, surface of the plurality of same piezoelectric elements 810 (e.g., upper surfaces or lower surfaces shown in FIG. 8) may be located in a same plane, so that the mass block 822 may remain level relative to the surface of the piezoelectric element 810 without deflection during a vibration process. In some embodiments, the plurality of piezoelectric elements 810 may provide a better acoustic output effect, which represents that the piezoelectric speaker may output a greater volume when a same excitation signal is input. In some embodiments, the plurality of piezoelectric elements 810 may be distributed symmetrically around a centroid of the mass block 822 to reduce shaking modes of the mass block 822. Merely by way of example, a count of piezoelectric elements may be two, and the two piezoelectric elements 810 may be symmetrically distributed along a center line of the mass block 822. For example, the two piezoelectric elements 810 may be in a same straight line. When the user wears the speaker, the mass block 822 may fit with a face of a user, receive vibration from the piezoelectric element 810, and transmit the vibration to an auditory nerve of the user. Further description about the piezoelectric element 810, the elastic rod 821, and the mass block 822 may be found in FIG. 6 and the related description thereof.

It should be known that the piezoelectric element 810 shown in FIG. 8 includes double piezoelectric layers and the basal layer, and the piezoelectric element herein may also be a single piezoelectric layer and a basal layer as shown in FIG. 4. The cantilever beam structure mentioned in the present disclosure is not limited to a single piezoelectric layer or double piezoelectric layers. The cantilever beam structure may include n (n is a positive integer greater than 1) piezoelectric layers and n−1 basal layers. In a length direction perpendicular to the cantilever beam structure, the piezoelectric layer and the basal layer may be overlapped.

Figure 9:
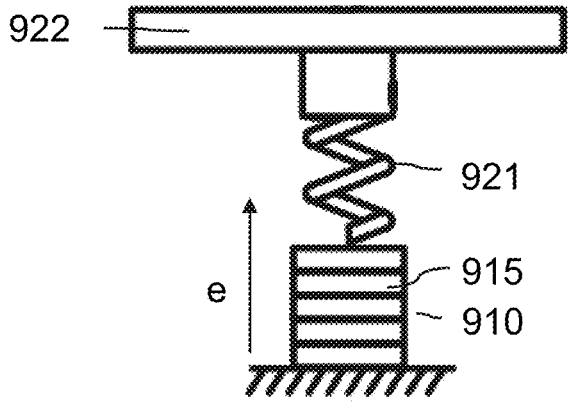
FIG. 9 is a schematic structural diagram illustrating a piezoelectric speaker according to some embodiments of the present disclosure.

FIG. 9 is a schematic structural diagram illustrating a piezoelectric speaker according to some embodiments of the present disclosure. As shown in FIG. 9, the piezoelectric speaker may include a piezoelectric element 910, an elastic rod 921, and a mass block 922 sequentially disposed from bottom to top. The piezoelectric element 910 may be connected with the mass block 922 through the elastic rod 921.

In some embodiments, the piezoelectric element 910 may be a laminated structure in which a plurality of piezoelectric layers 915 are stacked sequentially from top to bottom. Along a lamination direction of the laminated structure (refer to the direction e shown in FIG. 9), the piezoelectric element 910 may include a fixed end and a free end. The free end of the piezoelectric element 910 may be connected with the elastic rod 921, and the fixed end of the piezoelectric element 910 may be connected with other parts of the piezoelectric speaker (e.g., a housing). In some embodiments, the piezoelectric layer 915 may be in a shape of a ring, a cylinder, a prism (e.g., a cuboid, a triangular prism, etc.), etc. Further description about the fixed end and the free end may be found in FIG. 2 and the related description thereof. In some embodiments, the piezoelectric layer 915 may be made of piezoelectric material. A polarization direction of the piezoelectric element 910 composed of the piezoelectric layer 915 may be the same as a stress direction. At this time, when the piezoelectric element 910 is subjected to an electric field along the lamination direction, the piezoelectric element 910 may be subjected to stress in the lamination direction, the piezoelectric element 910 may vibrate in the lamination direction, and the mass block 922 may receive vibration of the piezoelectric element 910 through the elastic rod 921 and transmit the vibration to a user. For example, when the user wears the piezoelectric speaker, the mass block 922 may be in contact with a facial region of the user to transmit the vibration to the user. As another example, the mass block 922 may be connected with the housing of the piezoelectric speaker, or the housing may be connected with the elastic rod 921 as the mass block 922, and the housing may receive the vibration of the piezoelectric element 910. When the user wears the piezoelectric speaker, part structure of the housing may be in contact with the facial region of the user and transmit the vibration to the user.

In some embodiments, one end of the elastic rod 921 away from the piezoelectric element 910 may be connected with the mass block 922. In some embodiments, in order to transmit the vibration of the piezoelectric element 910 to the mass block 922 through the elastic rod 921, the elastic rod 921 may extend along the polarization direction of the piezoelectric element 910. In some embodiments, in order to enable the mass block 922 to output the vibration to other structures of the piezoelectric speaker (such as a vibration plate), the mass block 922 may extend along a direction perpendicular to the elastic rod 921.

Figure 10:
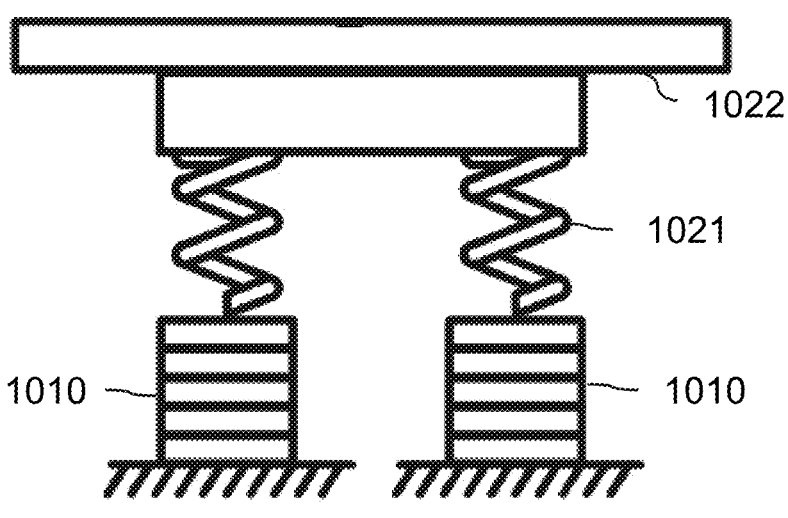
FIG. 10 is a schematic structural diagram illustrating another piezoelectric speaker according to some embodiments of the present disclosure.

FIG. 10 is a schematic structural diagram illustrating another piezoelectric speaker according to some embodiments of the present disclosure. An overall structure of the piezoelectric speaker shown in FIG. 10 may be similar to an overall structure of the piezoelectric speaker shown in FIG. 9. A main difference may be that there is a plurality of piezoelectric elements 1010 and elastic rods 1021 shown in FIG. 10, for example, two piezoelectric elements 1010 and two elastic rods 1021 shown in FIG. 10. The piezoelectric element 1010, the elastic rod 1021, and a mass block 1022 shown in FIG. 10 may be similar to a piezoelectric element 910, an elastic rod 921, a mass block 922, etc. shown in FIG. 9, respectively, which are not repeated herein. As shown in FIG. 10, each piezoelectric element 1010 may be connected with the mass block 1022 through the elastic rod corresponding to the piezoelectric element 1010. The mass block 1022 may receive vibration of the plurality of piezoelectric elements 1010 through the elastic rods 1021. Vibration acceleration of the plurality of piezoelectric elements 1010 may be superimposed on the mass block 1022 to improve the acoustic output effect of the piezoelectric speaker. Further description about the piezoelectric element 1010, the elastic rod 1021, and the mass block 1022 may be found in the present disclosure, such as FIG. 2, FIG. 9 and the related description thereof.

Figure 11:
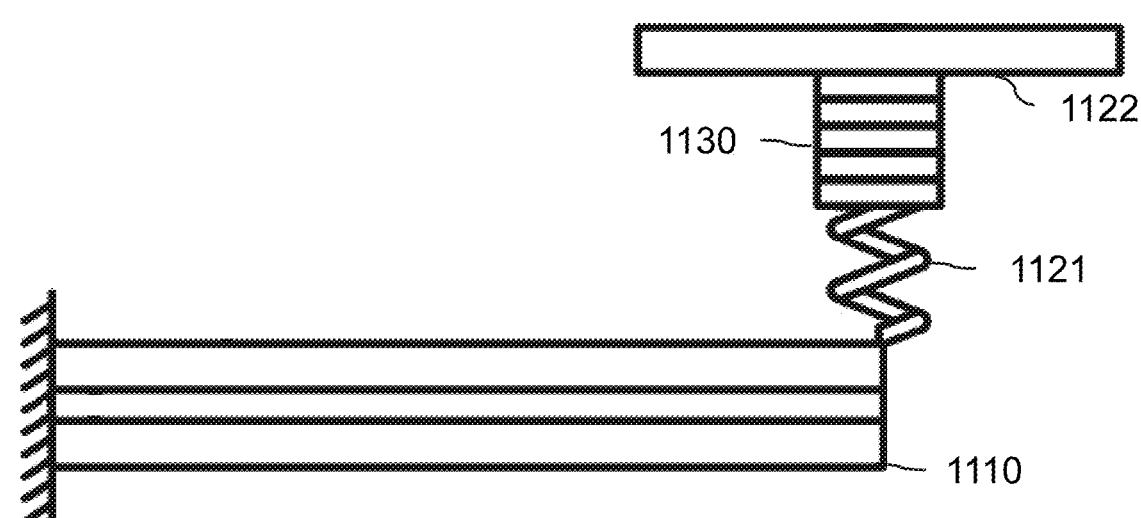
FIG. 11 is a schematic structural diagram illustrating a piezoelectric speaker according to some embodiments of the present disclosure.

FIG. 11 is a schematic structural diagram illustrating a piezoelectric speaker according to some embodiments of the present disclosure. An overall structure of the piezoelectric speaker shown in FIG. 11 may be similar to an overall structure of the piezoelectric speaker shown in FIG. 4. A main difference may be that a laminated piezoelectric element 1130 with a laminated structure is disposed between an elastic rod 1121 and a mass block 1122 shown in FIG. 11. A piezoelectric element 1110, the elastic rod 1121, and the mass block 1122 shown in FIG. 11 may be similar to an elastic rod 421, a mass block 422, etc. shown in FIG. 4, which are not repeated herein. As shown in FIG. 11, one end of the elastic rod 1121 may be connected with the laminated piezoelectric element 1130, and a top of the laminated piezoelectric element 1130 may be connected to the mass block 1122.

In some embodiments, a polarization direction of the piezoelectric element 1110 may be perpendicular to a stress direction. When the piezoelectric element 1110 is subjected to an electric field perpendicular to a surface of the piezoelectric element 1110, the piezoelectric element 1110 may be subjected to stress along a long axis direction of a cantilever beam structure. At this time, the piezoelectric layer of the piezoelectric element 1110 may deform to drive the overall structure of the piezoelectric element 1110 to deform, thereby generating vibration along the polarization direction of the piezoelectric layer, and the polarization direction of the piezoelectric element 1110 may be a thickness direction of the piezoelectric element 1110. In some embodiments, the elastic rod 1121 may extend along the polarization direction of the piezoelectric element 1110. In some embodiments, the laminated piezoelectric element 1130 may receive the vibration transmitted by the piezoelectric element 1110 through the elastic rod 1121.

In some embodiments, the laminated piezoelectric element 1130 is similar to a structure of a piezoelectric element 910 shown in FIG. 9, and the laminated piezoelectric element 1130 may be respectively connected with the mass block 1122 and the elastic rod 1121 along the top and bottom of the lamination direction. The lamination direction of the laminated piezoelectric element 1130 may be the same as the polarization direction of the piezoelectric element 1110, i.e., the thickness direction. When the laminated piezoelectric element 1130 receives the stress transmitted by the elastic rod 1121 along the lamination direction, the laminated piezoelectric element 1130 may vibrate in the lamination direction, and transmit vibration to the mass block 1122. In some embodiments, in order to enable the mass block 1122 to output the vibration to other structures of the piezoelectric speaker (e.g., a vibration plate), the mass block 1122 may extend the lamination direction perpendicular to the laminated piezoelectric element 1130. The laminated piezoelectric element 1130 may be connected with the bottom of the mass block 1122. The mass block 1122 may receive the vibration of the laminated piezoelectric element 1130 and transmit the vibration to a user. For example, when the user wears the piezoelectric speaker, the mass block 1122 may be in contact with a facial region of the user to transmit the vibration to the user. As another example, the mass block 1122 may be connected with a housing of the piezoelectric speaker, or the housing may be connected with the elastic rod 1121 as the mass block 1122, and the housing may receive the vibration of the piezoelectric element 1110. When the user wears the piezoelectric speaker, part structure of the housing may be in contact with the facial region of the user and transmit the vibration to the user.

In some embodiments, the laminated piezoelectric element 1130 and the mass block 1122 may receive the vibration from the piezoelectric element 1110, which can have a relatively good acoustic output effect at both a low frequency and a high frequency. The laminated piezoelectric element 1130 and the mass block 1122 may provide mass, and the elastic rod 1121 may provide elasticity, so that the piezoelectric speaker may form a resonance peak at the low frequency. In some embodiments, the laminated piezoelectric element 1130 may have a relatively good frequency response at the high frequency. The frequency response of the piezoelectric speaker in a high-frequency band (e.g., within a frequency range of 5000 Hz-40000 Hz) may be enhanced by disposing the laminated piezoelectric element 1130.

Figure 12:
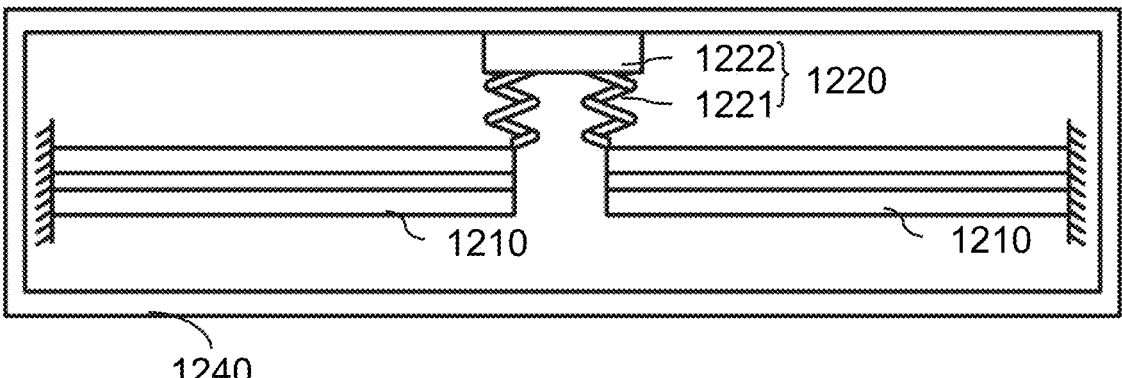
FIG. 12 is a schematic structural diagram illustrating a bone conduction piezoelectric speaker according to some embodiments of the present disclosure.

FIG. 12 is a schematic structural diagram illustrating a bone conduction piezoelectric speaker according to some embodiments of the present disclosure. An overall structure of the piezoelectric speaker shown in FIG. 12 may be similar to an overall structure of the piezoelectric speaker shown in FIG. 8. A main difference may be that the piezoelectric speaker shown in FIG. 12 further includes a housing 1240. An elastic rod 1221, a mass block 1222, and a piezoelectric element 1210 may be similar to an elastic rod 821, a mass block 822, a piezoelectric element 810, etc. shown in FIG. 8, which are not repeated herein. As shown in FIG. 12, the piezoelectric speaker may include the housing 1240, the piezoelectric element 1210, and a vibration transmission plate 1220. The vibration transmission plate 1220 may include the elastic rod 1221 and the mass block 1222, which may be found elsewhere in the present disclosure, for example, FIG. 8 and the related description thereof.

In some embodiments, the housing 1240 may be a three-dimensional structure with an accommodation space. In some embodiments, the housing 1240 may be a regular structure such as a cylinder structure, a cuboid structure, an ellipsoid structure, a terrace structure, etc. or an irregular structure. In some embodiments, the accommodation space inside the housing 1240 may have a shape same as or different from a shape of an outer contour of the housing 1240. For example, the shape of the outer contour of the housing 1240 may be a cuboid, and the shape of the accommodation space may also be a cuboid. As another example, the shape of the outer contour of the housing 1240 may be a cuboid, and the shape of the accommodation space may be a sphere.

Taking the housing 1240 as a cylindrical structure as an example, a plurality of piezoelectric elements 1210 and the vibration transmission plate 1220 may be located in the accommodation space of the housing 1240. One end of the mass block 1222 away from the piezoelectric element 1210 may be connected with a side wall corresponding to one end of the housing 1240. The plurality of piezoelectric elements 1210 may be suspended in the accommodation space of the housing 1240 through the mass block, so that the housing 1240 may move relative to the piezoelectric element 1210. In some embodiments, the housing 1240 may receive vibration from the piezoelectric element 1210 through the vibration transmission plate 1220. When the user wears the piezoelectric speaker, at least part structure of the housing 1240 may be in direct contact with a facial region of the user. The housing 1240 may transmit the received vibration directly to an auditory nerve of the user through muscles, bones, blood, etc. of the user, so that the user may hear sound information corresponding to a sound signal. The housing 1240 herein may be configured to protect the piezoelectric element 1210 and the vibration transmission plate 1220 and transmit the sound signal to the user. In some embodiments, the side wall of the housing 1240 connected with the mass block 1222 may be in contact with the facial region of the user. In some embodiments, one end of the housing 1240 away from the mass block 1222 may also be in contact with the facial region of the user.

Figure 13:
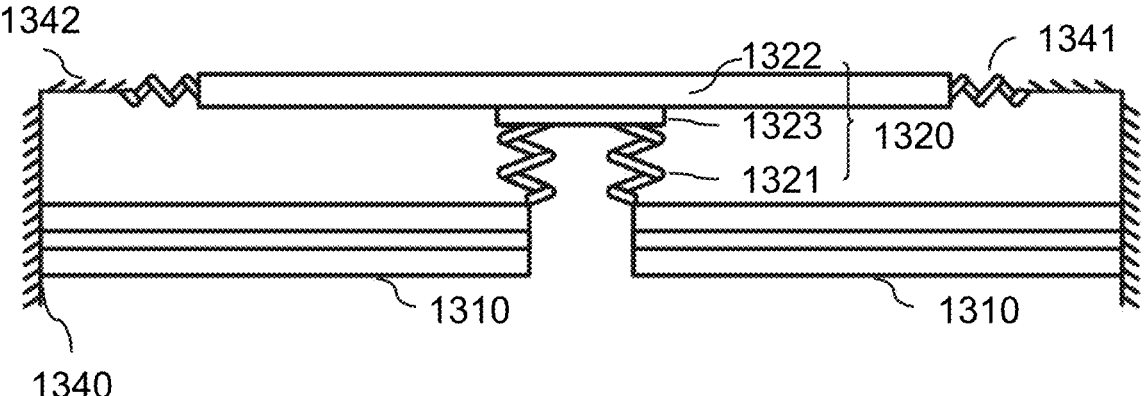
FIG. 13 is a schematic structural diagram illustrating another bone conduction piezoelectric speaker according to other embodiments of the present disclosure.

FIG. 13 is a schematic structural diagram illustrating another bone conduction piezoelectric speaker according to other embodiments of the present disclosure. An overall structure of the piezoelectric speaker shown in FIG. 13 may be similar to an overall structure of the piezoelectric speaker shown in FIG. 12. A main difference may be that a structure of a housing 1340 shown in FIG. 13 is different from a structure of a housing 1240 shown in FIG. 12. An elastic rod 1321 and a mass block 1322 shown in FIG. 13 may be similar to an elastic rod 1221, a mass block 1222, a piezoelectric element 1210, etc. shown in FIG. 12 (i.e., FIG. 8), respectively, which are not repeated herein. As shown in FIG. 13, the piezoelectric speaker may include the housing 1340. Further description about a piezoelectric element 1310 and a vibration transmission plate 1320 may be found elsewhere in the present disclosure, such as FIG. 8 and the related description thereof.

In some embodiments, the housing 1340 may be a columnar structure with an accommodation space. The accommodation space may be an opening space. In some embodiments, one end of each piezoelectric element 1310 may be fixedly connected with a side wall of the housing 1340 to form a fixed end of the piezoelectric element 1310. In some embodiments, one end of each piezoelectric element 1310 away from the housing 1340 may be connected with the elastic rod 1321 to form a free end of the piezoelectric element 1310. In some embodiments, the housing 1340 may include a top wall 1342 that fitted to a head region of a user. The central region of the top wall 1342 may have a first opening. The mass block 1322 may be located at the first opening. A side of the mass block 1322 outside the housing 1340 may be fitted to the head region of the user. The mass block 1322 may be connected with the housing 1340 at the first opening. In some embodiments, in order to make connection between the mass block 1322 and the housing 1340 not affect a vibration state of the mass block 1322, the mass block 1322 may be connected with the housing 1340 through an elastic rod 1341. In some embodiments, the mass block 1322 may be connected with the top wall through the elastic rods 1341 disposed on a circumferential side of the mass block 1322. In some embodiments, the vibration transmission plate 1320 may convert mechanical vibration from the piezoelectric element 1310 into a mechanical wave. When the user wears the piezoelectric speaker, the side of the mass block 1322 outside the housing 1340 may be in direct contact with the facial region of the user. The mass block 1322 may transmit vibration directly to an auditory nerve of the user through muscles, bones, blood, etc. of the user, so that the user may hear sound information corresponding to a sound signal. The housing 1340 herein may be configured to protect and support the piezoelectric element 1310 and the vibration transmission plate 1320.

In some embodiments, in order to facilitate assembly of the piezoelectric speaker and facilitate balancing the moment provided by the plurality of elastic rods 1321 for the mass block 1322, there may be a first connecting piece 1323 between the mass block 1322 and the plurality of elastic rods 1321. In some embodiments, each elastic rod 1321 may be connected with the first connecting piece 1323 by means of bonding. Similarly, the first connecting piece 1323 may also be connected with the mass block 1322 by means of bonding. In order to transmit force transmitted from the elastic rod 1321 to the first connecting piece 1323 to the mass block 1322 more evenly, a sum of bonding area of all the elastic rods 1321 and the first connecting piece 1323 may be less than bonding area of the first connecting piece 1323 and the mass block 1322.

Figure 14:
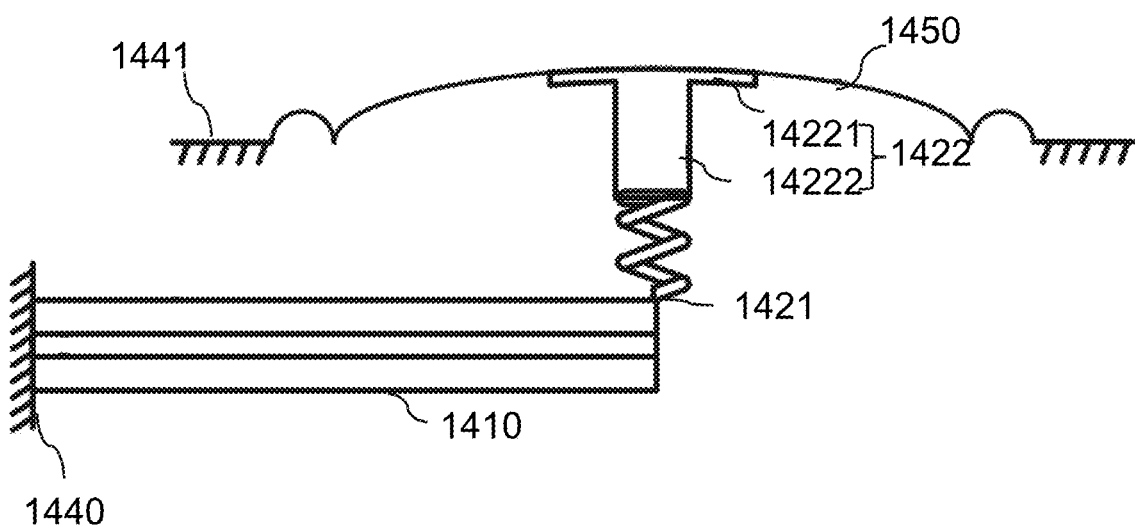
FIG. 14 is a schematic diagram illustrating a partial structure of an air conduction piezoelectric speaker according to some embodiments of the present disclosure.

FIG. 14 is a schematic diagram illustrating a partial structure of an air conduction piezoelectric speaker according to some embodiments of the present disclosure. As shown in FIG. 14, the piezoelectric speaker may include a piezoelectric element 1410, an elastic rod 1421, a mass block 1422, a housing 1440, and a diaphragm 1450. The piezoelectric element 1410 and the elastic rod 1421 may be similar to a piezoelectric element 610, an elastic rod 621, etc. shown in FIG. 6, which are not repeated herein. A fixed end of the piezoelectric element 1410 may be fixed with the housing 1440. A free end of the piezoelectric element 1410 may be connected with the elastic rod 1421. The elastic rod 1421 may be connected with a bottom of the mass block 1422. A top of the mass block 1422 may be connected with the diaphragm 1450. A circumferential side of the diaphragm 1450 may be connected with the housing 1440.

In some embodiments, the housing 1440 may be a columnar structure with an accommodation space. Further description about the housing 1440 may be found in FIG. 13. In some embodiments, the plurality of piezoelectric elements 1410 and a vibration transmission plate may be located in the accommodation space. The vibration transmission plate may include the plurality of elastic rods 1421 and a mass block 1422 corresponding to the plurality of piezoelectric elements 1410.

In some embodiments, the diaphragm 1450 may be connected to the plurality of piezoelectric elements 1410 through the vibration transmission plate (the elastic rod 1421 and the mass block 1422). In some embodiments, one end of the piezoelectric element 1410 may be connected with a side wall of the housing 1440. One end of the piezoelectric element 1410 relatively far away from the housing 1440 may be connected with the elastic rod 1421. In some embodiments, the piezoelectric element 1410 may be a cantilever beam structure (such as a piezoelectric element 810 shown in FIG. 8). A polarization direction of the piezoelectric element 1410 may be perpendicular to a stress direction. When the piezoelectric element 1410 is subjected to an electric field perpendicular to a surface of the piezoelectric element 1410, the piezoelectric element 1410 may be subjected to stress along a length direction of the cantilever beam structure. At this time, a piezoelectric layer of the piezoelectric element 1410 may deform to drive an overall structure of the piezoelectric element 1410 to deform, thereby generating vibration in the polarization direction. The elastic rod 1421 may extend in the polarization direction of the piezoelectric element 1410. The plurality of piezoelectric elements 1410 may drive the diaphragm 1450 to vibrate through the elastic rod 1421 and the mass block 1422. The diaphragm 1450 may vibrate in the polarization direction of the piezoelectric element 1410. The vibration direction of the plurality of piezoelectric elements 1410 may be the same as a vibration direction of the diaphragm 1450.

In some embodiments, the piezoelectric element 1410 may also be a laminated structure (e.g., a piezoelectric element 910 shown in FIG. 9). The polarization direction of the piezoelectric element 1410 may be the same as the stress direction. When the piezoelectric element 1410 is subjected to an electric field perpendicular to the surface of the piezoelectric element 1410, the piezoelectric element 1410 may be subjected to stress in a lamination direction, and the piezoelectric element 1410 may vibrate in the lamination direction. The elastic rod 1421 may extend in the polarization direction of the piezoelectric element 1410. The plurality of piezoelectric elements 1410 may drive the diaphragm 1450 to vibrate by acting on the elastic rod 1421 and the mass block 1422. The vibration direction of the plurality of piezoelectric elements 1410 may be the same as the vibration direction of the diaphragm 1450.

The mass block 1422 may be connected with the diaphragm 1450. The diaphragm 1450 may vibrate under the drive of the mass block 1422, thereby driving air near the diaphragm 1450 to vibrate, and generating an air conduction sound wave. When a user wears the piezoelectric speaker, the air conduction sound wave may pass to ears of the user through the air. The housing 1440 may be configured to support the piezoelectric element 1410 and the diaphragm 1450.

In some embodiments, the housing 1440 may include a first side wall 1441. A central region of the first side wall 1441 may be provided with a second opening. The diaphragm 1450 may be located at the second opening and may be connected with the side wall of the housing 1440 corresponding to the second opening through a circumferential side of the diaphragm. The housing 1440 may be configured to provide an audio output end of the piezoelectric speaker.

In some embodiments, in order to increase an area of a vibration output region of the mass block 1422 or increase a contact area between the mass block 1422 and the diaphragm 1450, the mass block 1422 may include a first connecting part 14221 and a second connecting part 14222 connected in sequence. The first connecting part 14221 may be connected with the diaphragm 1450, and the second connecting part 14222 may be connected with the elastic rod 1421. A cross-sectional area of the first connecting part 14221 in the vibration direction perpendicular to the diaphragm 1450 may be greater than a cross-sectional area of the second connecting part 14222 in the vibration direction perpendicular to the diaphragm 1450.

Figure 15:
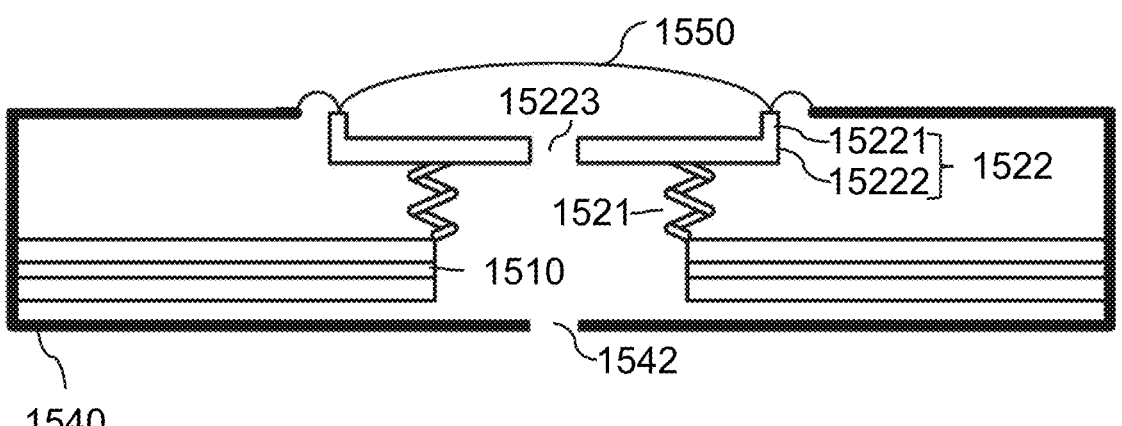
FIG. 15 is a schematic structural diagram illustrating an air conduction piezoelectric speaker with a rear cavity according to other embodiments of the present disclosure.

FIG. 15 is a schematic structural diagram illustrating an air conduction piezoelectric speaker with a rear cavity according to other embodiments of the present disclosure. As shown in FIG. 15, the piezoelectric speaker may include a piezoelectric element 1510, an elastic rod 1521, a mass block 1522, a housing 1540, and a diaphragm 1550. The housing 1540 may have an accommodation space. The accommodation space may be a closed space. The piezoelectric element 1510, the elastic rod 1521, and the mass block 1522 may be located in the accommodation space. A fixed end of the piezoelectric element 1510 may be fixed with the housing 1540. A free end of the piezoelectric element 1510 may be connected with the elastic rod 1521. The elastic rod 1521 may be connected with a bottom of the mass block 1522. A top of the mass block 1522 may be connected with the diaphragm 1550. A circumferential side of the diaphragm 1550 may be connected with the housing 1540. Further description about the piezoelectric element 1510 and the elastic rod 1521 may be found in FIG. 8 and the related description thereof, which are not repeated herein.

In some embodiments, the mass block 1522 may include a protrusion 15221 and a base 15222. The protrusion 15221 may be distributed along an edge of the base 15222. The protrusion 15221 may be connected with a folding ring of the diaphragm 1550, and the base 15222 may be connected with the plurality of elastic rods 1521. Further description about the piezoelectric speaker may be found in FIG. 14 and the related description thereof. The housing 1540 shown in FIG. 15 may be configured to protect and support the piezoelectric element 1510 and the diaphragm 1550, and provide an audio output end of the piezoelectric speaker.

In some embodiments, a first hole 15223 may be disposed on the base 15222. The first hole 15223 may penetrate through the base 15222 to penetrate through the accommodation space, so as to balance an air pressure change inside the accommodation space caused by a temperature change during a preparation process (e.g., a reflow soldering process) of the piezoelectric speaker, reduce or prevent damage to components caused by the air pressure change, such as cracking, deformation, etc. In some embodiments, a second hole 1542 may be disposed on a second side wall of the housing 1540 away from the second opening. The second hole 1542 may penetrate through the second side wall of the housing 1540.

Figure 16:
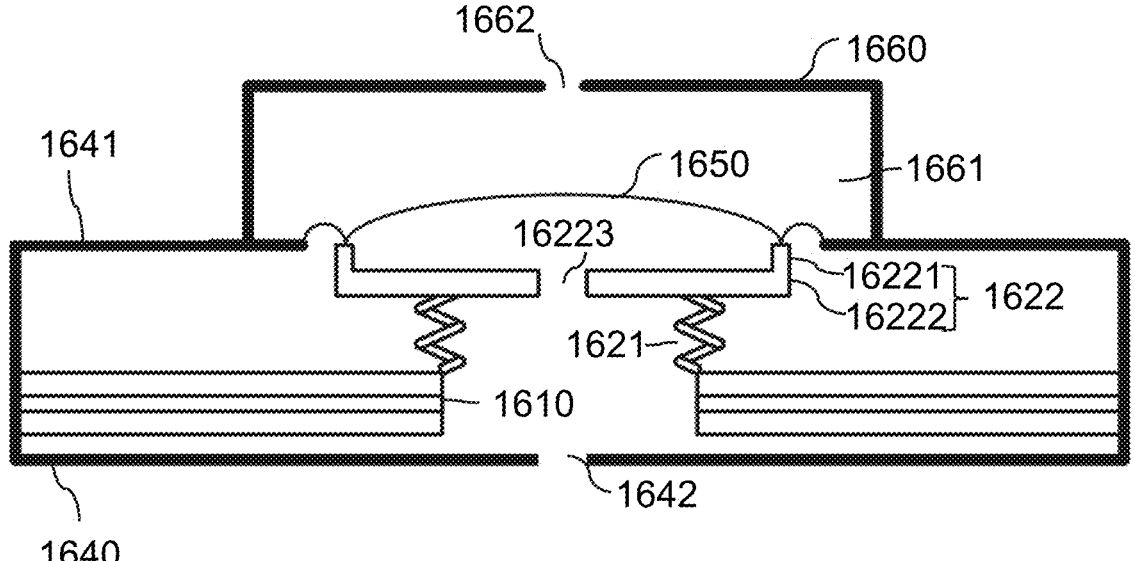
FIG. 16 is a schematic structural diagram illustrating an air conduction piezoelectric speaker with a front cavity and a rear cavity according to some embodiments of the present disclosure.

Based on the structure of the piezoelectric speaker shown in FIG. 15, the piezoelectric speaker may further include a first housing. FIG. 16 is a schematic structural diagram illustrating an air conduction piezoelectric speaker with a front cavity and a rear cavity according to some embodiments of the present disclosure. An overall structure of the piezoelectric speaker shown in FIG. 16 may be similar to an overall structure of the piezoelectric speaker shown in FIG. 15. A main difference may be that the piezoelectric speaker shown in FIG. 16 may further include a first housing 1660. A piezoelectric element 1610, an elastic rod 1621, a mass block 1622, a protrusion 16221, a base 16222, a first hole 16223, a second hole 1642, a housing 1640, and a diaphragm 1650 shown in FIG. 16 may be similar to a piezoelectric element 1510, an elastic rod 1521, a mass block 1522, a protrusion 15221, a base 15222, a first hole 15223, a second hole 1542, a housing 1540, a diaphragm 1550, etc. shown in FIG. 15, which are not repeated herein.

As shown in FIG. 16, the piezoelectric speaker may include the first housing 1660. One end of the first housing 1660 may be an opening end. The opening end of the first housing 1660 may be sealed with a first side wall 1641 of the housing 1640 (e.g., bonding). The first side wall 1641, the diaphragm 1650, and the first housing 1660 may form the front cavity 1661. In some embodiments, at least one sound hole 1662 may be disposed on a side wall of the first housing. Vibration of the diaphragm 1650 in the front cavity 1661 may cause a change of air pressure in the front cavity 1661, thereby forming a sound wave, which may be released outward by the sound hole 1662. In some embodiments, the first housing 1660 and the housing 1640 may be integrally formed. In some embodiments, the first housing 1660 and the housing 1640 may be mutually independent structures. The first housing 1660 and the housing 1640 may be connected to form a housing structure of the piezoelectric speaker.

It should be known that the structures of the piezoelectric element and the housing shown in FIGS. 12-16 are merely for exemplary illustration, and not intended to limit. In some embodiments, the piezoelectric elements shown in FIGS. 12-16 may be the laminated structure in which a plurality of ring-shaped structural layers are stacked in sequence. In some embodiments, the housing may be a shape conforming to a human ear.

It should be noted that different embodiments may have different beneficial effects. In different embodiments, the possible beneficial effects may include any combination of one or more of the above, or any other possible beneficial effects that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A piezoelectric speaker, comprising:
a plurality of piezoelectric elements, wherein each piezoelectric element is configured to generate vibration based on an audio signal; and a vibration transmission plate including a plurality of elastic rods and a mass block, wherein each elastic rod connects the mass block and one of the plurality of piezoelectric elements, and the mass block simultaneously receives vibration of the plurality of piezoelectric elements and generates at least two resonance peaks in a frequency range of 20 Hz-40000 Hz.

2. The piezoelectric speaker of claim 1, wherein the at least two resonance peaks include a first resonance peak and a second resonance peak, and a resonant frequency range corresponding to the first resonance peak is 50 Hz-2000 Hz; a resonant frequency range corresponding to the second resonance peak is 1000 Hz-40000 Hz; and a resonant frequency corresponding to the first resonance peak is less than a resonant frequency corresponding to the second resonance peak.

3. The piezoelectric speaker of claim 2, wherein a ratio of an elastic coefficient of the plurality of elastic rods to the mass of the mass block is within a range of $4.9 \times 10^6$ N/(m*kg)–$3.2 \times 10^{11}$ N/(m*kg).

4. The piezoelectric speaker of claim 1, wherein the piezoelectric element includes a piezoelectric layer and a basal layer, the piezoelectric layer is attached to one side of the basal layer, and the piezoelectric layer or the basal layer is connected with one of the plurality of elastic rods.

5. The piezoelectric speaker of claim 4, wherein a projected area of the piezoelectric layer in a thickness direction of the piezoelectric element is less than a projected area of the basal layer in the thickness direction of the piezoelectric element.

6. The piezoelectric speaker of claim 1, wherein the piezoelectric element includes a first piezoelectric layer, a basal layer, and a second piezoelectric layer disposed in sequence, and the first piezoelectric layer and the the second piezoelectric layer are attached to both sides of the basal layer, respectively.

7. The piezoelectric speaker of claim 1, wherein a surface of the piezoelectric element is provided with a damping structural layer.

8. The piezoelectric speaker of claim 1, wherein the plurality of piezoelectric elements are evenly spaced along a circumferential side of the mass block, and lengths of the plurality of elastic rods connecting the plurality of piezoelectric elements and the mass block are same.

9. The piezoelectric speaker of claim 1, wherein the plurality of piezoelectric elements are spaced at intervals along a circumferential side of the mass block, and lengths of the plurality of elastic rods connecting the plurality of piezoelectric elements and the mass block are different.

10. The piezoelectric speaker of claim 8, wherein when the mass block vibrates in a direction perpendicular to a surface of the mass block, and moments of the plurality of elastic rods acting on a mass block are balanced in the direction perpendicular to the surface of the mass block.

11. The piezoelectric speaker of claim 10, wherein when the mass block vibrates in the direction perpendicular to the surface of the mass block, a difference between a maximum displacement value at the surface of the mass block and a minimum displacement value at the surface of the mass block is less than 0.3 mm in the direction perpendicular to the surface of the mass block.

12. The piezoelectric speaker of claim 1, wherein the piezoelectric speaker includes a housing having an accommodation space, the plurality of piezoelectric elements and the vibration transmission plate are located in the accommodation space, and the mass block of the vibration transmission plate is connected with a side wall corresponding to one end of the housing.

13. The piezoelectric speaker of claim 1, wherein the piezoelectric speaker includes a housing, the housing is a columnar structure with an accommodation space, the plurality of piezoelectric elements and the vibration transmission plate are located in the accommodation space, one end of each piezoelectric element is connected with a side wall of the housing, and one end of each piezoelectric element away from the housing is connected with one of the elastic rods; and the housing includes a top wall fitted to a head region of a user, and the mass block is connected with the top wall through the elastic rod disposed on a circumferential side of the mass block.

14. The piezoelectric speaker of claim 13, wherein there is a first connecting piece between the mass block and the plurality of elastic rods.

15. The piezoelectric speaker of claim 1, wherein the piezoelectric speaker includes a housing and a diaphragm, the diaphragm is connected with the housing, the housing is a columnar structure with an accommodation space, the plurality of piezoelectric elements and the vibration transmission plate are located in the accommodation space, the diaphragm and the plurality of piezoelectric elements are connected through the mass block, the plurality of piezoelectric elements drive the diaphragm to vibrate by acting on the mass block, and a vibration direction of the plurality of piezoelectric elements is the same as a vibration direction of the diaphragm.

16. The piezoelectric speaker of claim 15, wherein the housing includes a first side wall, a central region of the first side wall is provided with an opening, the diaphragm is located at the opening and is connected with a side wall of the housing corresponding to the opening through a circumferential side of the diaphragm.

17. The piezoelectric speaker of claim 15, wherein the mass block includes a first connecting part and a second connecting part connected in sequence, the first connecting part is connected with the diaphragm, and the second connecting part is connected with the elastic rod, wherein a cross-sectional area of the first connecting part along a direction perpendicular to the vibration direction of the diaphragm is greater than a cross-sectional area of the second connecting part along the direction perpendicular to the vibration direction of the diaphragm.

18. The piezoelectric speaker of claim 15, wherein the mass block includes a base and a protrusion, the protrusion is distributed along an edge of the base, the protrusion is connected with a folding ring of the diaphragm, and the base is connected with the plurality of elastic rods.

19. The piezoelectric speaker of claim 18, wherein a first hole is disposed on the base, and a second hole is disposed on a second side wall of the housing away from the opening.

20. The piezoelectric speaker of claim 19, wherein the piezoelectric speaker includes a first housing, one end of the first housing is an opening end, and the opening end is fitted to the first side wall, the first side wall, the diaphragm, and the first housing form a front cavity, and a sound hole is disposed on a side wall of the first housing.

* * * * *